(12) United States Patent
Poggi et al.

(10) Patent No.: US 6,683,496 B2
(45) Date of Patent: Jan. 27, 2004

(54) SYSTEM AND METHOD FOR MINIMIZING DISSIPATION IN RF POWER AMPLIFIERS

(75) Inventors: Peter John Poggi, Webster, NY (US); Tim Dittmer, Mason, OH (US); George Cabrera, Mason, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/931,737

(22) Filed: Aug. 20, 2001

(65) Prior Publication Data

US 2003/0034839 A1 Feb. 20, 2003

(51) Int. Cl.[7] .................................................. H03G 5/16
(52) U.S. Cl. .................. 330/132; 330/123; 330/127; 330/129; 330/136; 330/279; 330/285
(58) Field of Search ............................ 330/98, 123, 127, 330/279, 285

(56) References Cited

U.S. PATENT DOCUMENTS

| | | | | |
|---|---|---|---|---|
| 4,547,746 A | * | 10/1985 | Erickson et al. ............ 330/298 |
| 5,136,257 A | * | 8/1992 | Reading ...................... 330/129 |
| 5,420,536 A | * | 5/1995 | Faulkner et al. ............ 330/149 |
| 5,732,334 A | * | 3/1998 | Miyake ....................... 455/126 |
| 5,774,017 A | * | 6/1998 | Adar ............................ 330/51 |
| 5,880,635 A | * | 3/1999 | Satoh .......................... 330/144 |
| 5,977,833 A | * | 11/1999 | Attimont et al. ............ 330/141 |
| 6,137,355 A | * | 10/2000 | Sevic et al. .................... 330/51 |

* cited by examiner

Primary Examiner—Michael Tokar
Assistant Examiner—Linh Van Nguyen
(74) Attorney, Agent, or Firm—Duane Morris LLP

(57) ABSTRACT

The variable power supply to an amplifier in an electrical circuit is dynamically controlled through the use of a lookup table responsive to one or more operating conditions of the electrical circuit. The lookup table is indexed by one or more of the operating conditions and the amount of amplification to be applied to an input signal to the amplifier is determined. One embodiment of the invention comprises a television transmitter circuit including a power amplifier circuit capable of amplifying a variable frequency COFDM or 8VSB input signal where the amount of amplification applied to the input signal is dynamically controlled through the use of a lookup table as a function of the frequency of the input signal.

30 Claims, 5 Drawing Sheets

| LOOKUP TABLE | |
|---|---|
| OP. COND. 1 | CONTROL SIGNAL 1 |
| OP. COND. 2 | CONTROL SIGNAL 2 |
| OP. COND. 3 | CONTROL SIGNAL 3 |
| ... | ... |
| OP. COND. N | CONTROL SIGNAL N |

FIGURE 2

SYSTEM AND METHOD FOR MINIMIZING DISSIPATION IN RF POWER AMPLIFIERS

BACKGROUND OF THE INVENTION

The design of radio frequency ("RF") power amplifiers is typically accomplished by taking into account the expected operating environment of the amplifier and the desired output characteristics of the amplifier, such as the output load line impedance. There are usually interrelated yet contradictory requirements that must be taken into account in setting the output load line impedance and trade-offs must be made that affect the performance of the amplifier. Some of the factors to be considered in setting the output load line impedance are output peak and average signal requirements, distortion limits, efficiency requirements, and the available power supply voltage. The trade-off problem is made more acute when the amplifier is to be designed for high peak to average signal conditions, such as those found in Trellis Coded 8-Level Vestigial Side Band ("8VSB") and/or Coded Orthogonal Frequency Division Multiplexing ("COFDM") television transmitters.

For instance, one example of the contradictory requirements and trade-offs that need to be made involves the distortion limit of an amplifier. Typically, a designer strives to keep distortion to a minimum and amplifier efficiency to a maximum. The distortion limit is set by the maximum linear amplifier output power of the amplifier. The maximum linear output is a function of the amplifier output load line impedance and the voltage supplied to the amplifier by a power supply, e.g., the drain source power supply. A lower output load line impedance and a higher amplifier supply voltage typically result in a higher maximum linear output (i.e., a higher distortion limit), all other factors being relatively constant. A higher distortion limit allows for more amplifier head room before the negative effects of distortion, such as non-linear amplification and a lack of spectral containment, need to be considered. However, the efficiency of the amplifier depends on the output signal level in relation to the maximum linear output such that amplifier efficiency increases as the output signal level increases up to and beyond the maximum linear output power of the amplifier. Therefore, maximum amplifier efficiency is attained in the distortion operating region.

As mentioned above, 8VSB and COFDM signals have high peak to average power ratios. An 8VSB signal has a peak to average power ratio in the range of 5 to 8 dB, typically around 6.5 dB. A COFDM signal has a peak to average power ratio in the range of 7 to 11 dB, typically around 9 dB. For either an 8VSB or COFDM signal, in order to have acceptable spectral containment of the output signal, signal peaks may only exceed the distortion limit, i.e., push the amplifier into its non-linear region, by a limited amount. As a result, the output signal average power is well below the amplifier's maximum linear power capability therefore resulting in a low amplifier efficiency.

One drawback of a low amplifier efficiency is that the amplifier must dissipate the excess power as heat. Reliable amplifier design depends on, among other things, maintaining reasonable limits on transistor junction temperatures. Low amplifier efficiencies require cooling systems with a higher heat transfer capacity, and therefore higher cost, in order to prevent overheating and subsequent failure of the amplifier.

Where an amplifier is designed to operate over a range of frequencies ("wide band") the load line impedance will change due to the natural behavior of the amplifier's output network as a function of the frequency of the input signal to the amplifier. Typical prior art wide band amplifiers are designed based on a minimum average output power capability and are operated at the same average output power capability at all frequencies.

However, a wide band amplifier designed for a minimum average output power capability over all frequencies in its range will have a higher capability, at most frequencies, to operate at an average output power that is greater than the minimum average output power capability. This is due to the fact that designing for a minimum average power capability means designing an output network whose load line is never higher (as input signal frequency varies) than the impedance dictated by the drain supply voltage for that power level. Since it is impossible to eliminate variations in the impedance transformation of the network, the impedance the network presents at other frequencies will always be lower than the design target impedance at the design minimum average output power capability. The reduced efficiency will define the worst case efficiency and hence the worst case excess power dissipation requirement.

The present invention takes advantage of the fact that it is possible to operate a wide band power amplifier at an applied supply voltage other than the operating voltage for a given design condition, such as the minimum target power condition described above. For example, if a wide band amplifier is operated at the same average output power at two frequencies and the load line impedance is higher for one of the two frequencies, the amplifier will operate at a higher efficiency where the load line impedance is higher. This is due to the fact that the amplifier makes more effective use of the applied voltage swing allowed by the applied power supply voltage, e.g., $V_{CC}$ where the impedance is higher. In the case where the load line impedance is lower for the same average output power, the amplifier is being supplied with more supply voltage than required by the amplifier resulting in an increase in excess power and a decrease in the efficiency of the amplifier. In order to decrease the excess power and thereby increase the efficiency of the amplifier, the amplifier supply voltage can be decreased.

Therefore, once the design of the amplifier and the electrical circuit to which the amplifier is connected is known, the behavior of the load line can be characterized as a function of one or more of the operating conditions of the amplifier and/or electrical circuit, specifically the frequency of the input signal to the amplifier. Other operating conditions that are related in a known manner to a change in the input signal frequency may be sensed. Therefore, the effects of the changing load line due to the changing operating conditions can be compensated for by adjusting the voltage supplied to the amplifier by the amplifier power supply as a function of one or more of the sensed operating conditions. Some of the operating conditions that may change, and therefore indicate a change in the input signal frequency, and can be sensed as affecting the load line impedance are the frequency of the input signal to the amplifier, the impedance of the electrical circuit to which the amplifier is connected, the efficiency of the amplifier, the modulation of the input signal to the amplifier, the ratio of peak power to average power of the input signal to the amplifier, and the ratio of peak voltage to average voltage of the input signal to the amplifier. It is to be understood that other operating conditions of the amplifier or the electrical circuit to which the amplifier is connected may also affect the load line impedance of the amplifier and are contemplated by the present invention.

The present invention overcomes the limitations of the prior art by enabling the voltage supplied to the amplifier by the amplifier power supply to be adjusted either dynamically as a function of one or more of the operating conditions described above or manually by an operator either in response to or independently of one or more of the operating conditions. For example, the operator may be informed as to the input signal frequency by sources not based on a measurement of the input signal frequency, such as when the operator is told by another (e.g., the system user) that the input signal frequency either is a certain value or will be changed to a certain value.

Accordingly, it is an object of the present invention to obviate many of the above problems in the prior art and to provide a novel amplifier system and method for dynamically adjusting the power supplied to an amplifier.

It is another object of the present invention to provide a novel amplifier system and method where a look up table is used in determining the amount of amplification to be applied by an amplifier to an input signal of any frequency within the frequency range of the amplifier and of any type of modulation.

It is yet another object of the present invention to provide a novel amplifier for amplifying an input signal as a function of one or more operating condition of the circuit to which the amplifier is connected by the use of a lookup table responsive to one or more of the operating conditions to determine the modification of the power supplied to the amplifier.

It is still another object of the present invention to provide a novel amplifier control circuit including a lookup table for effecting a modification in the voltage supplied to an amplifier in response to one or more operating conditions of the circuit to which the amplifier is connected, where the look up table is used in determining the relationship between the one or more operating conditions and a modification in the voltage supplied to the amplifier.

It is a further object of the present invention to provide a novel amplifier system and method for dynamically controlling the voltage applied to the amplifier through the use of a lookup table as a function of one or more of the following operating conditions: the frequency of the input signal to the amplifier, the impedance of the electrical circuit to which the amplifier is connected, the efficiency of the amplifier, the modulation of the input signal to the amplifier, the ratio of peak power to average power of the input signal to the amplifier, or the ratio of peak voltage to average voltage of the input signal to the amplifier.

It is yet a further object of the present invention to provide a novel amplifier system and method for dynamically controlling the voltage applied to the amplifier through the use of a lookup table as a function of the input signal to the amplifier where the input signal is either a COFDM signal or an 8VSB signal.

It is still a further object of the present invention to provide a novel amplifier system and method for dynamically controlling the amplification applied by an amplifier to an input signal through the use of a lookup table as a function of the input signal where the input signal is a COFDM signal with a peak to average power ratio in the range of 7 to 11 dB.

It is an additional object of the present invention to provide a novel amplifier system and method for dynamically controlling the amplification applied by an amplifier to an input signal through the use of a lookup table as a function of the input signal where the input signal is an 8VSB signal with a peak to average power ratio in the range of 5 to 8 dB.

It is yet an additional object of the present invention to provide a novel amplifier system and method for dynamically controlling the amplification applied by an amplifier to an input signal through the use of a lookup table as a function of the input signal where the input signal is a COFDM signal with a peak to average power ratio of approximately 9 dB.

It is still an additional object of the present invention to provide a novel amplifier system and method for dynamically controlling the amplification applied by an amplifier to an input signal through the use of a lookup table as a function of the input signal where the input signal is an 8VSB signal with a peak to average power ratio of approximately 6.5 dB.

It is a further additional object of the present invention to provide a novel television transmitter circuit including a power amplifier circuit capable of amplifying a variable frequency COFDM or 8VSB input signal where the amount of amplification applied to the input signal is dynamically controlled through the use of a lookup table as a function of the frequency of the input signal.

It is yet a further additional object of the present invention to provide a novel amplifier control circuit for dynamically adjusting the power supplied to an amplifier as a function of one or more of the operating conditions of the amplifier and/or the electrical circuit to which the amplifier is connected.

It is still a further additional object of the present invention to provide a novel amplifier system and method where the voltage applied to an amplifier can be either (a) dynamically controlled as a function of one or more operating condition of the amplifier and/or the electrical circuit to which the amplifier is connected, or (b) controlled by an operator via a user interface module in response to (i) one or more of the operating conditions, (ii) knowledge of the frequency of the input signal gained from other than a measurement of the input signal frequency, or (c) independently of the operating conditions.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 2 is a depiction of a lookup table illustrating the indexing of the table by operating conditions so as to extract a control signal(s).

DESCRIPTION OF PREFERRED EMBODIMENTS

Present known amplifier arrangements, especially for television transmitters for signals with large peak to average power ratios such as 8VSB and COFDM signals, do not take advantage of the fact that the efficiency of the amplifier, or amplifier network, can be improved by dynamically controlling the amplifier power control voltage as a function of one or more operating condition, as defined above, while maintaining acceptable levels of distortion and spectral containment.

The present invention overcomes the limitations of the prior art by enabling the voltage supplied to the amplifier, or amplifier network, by the amplifier power supply to be adjusted either dynamically as a function of one or more of the operating conditions described above or manually by an operator either in response to or independently of one or more of the operating conditions. The amplifier network may be a cascaded series of amplifiers or a parallel cascade of amplifiers. The amplifiers in a network of amplifiers may be supplied with power either from independent variable power supplies or from a common variable power supply.

In one embodiment of the present invention, the variable power supply to an amplifier in an electrical circuit is dynamically controlled through the use of a lookup table responsive to one or more of the operating conditions of the electrical circuit. The lookup table is indexed by one or more of the operating conditions and the amount of amplification to be applied to an input signal to the amplifier is determined. Another embodiment of the invention comprises a television transmitter circuit including an RF power amplifier circuit capable of amplifying a variable frequency COFDM or 8VSB input signal where the amount of amplification applied to the input signal is dynamically controlled through the use of a lookup table as a function of the frequency of the input signal.

With reference to the drawings, like numerals represent like components throughout the several drawings.

Figure 1:
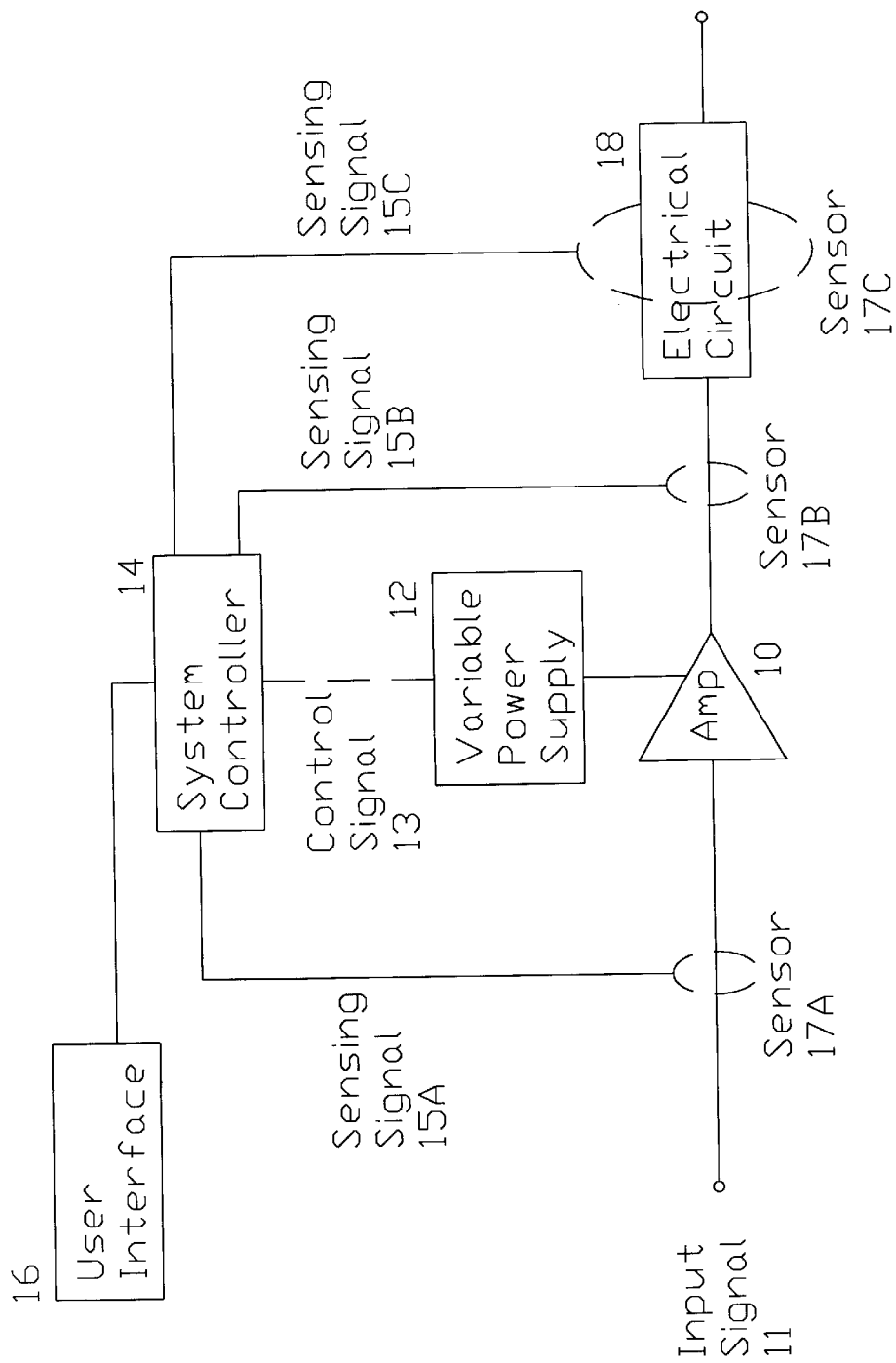
FIG. 1 is a simplified schematic circuit diagram of a first embodiment of the present invention illustrating a single amplifier stage.

With reference now to the embodiment of the present invention shown in FIG. 1, the amplifier 10 receives an input signal 11 and outputs a signal to an electrical circuit 18 depicted simply as a block in FIG. 1 for clarity purposes. It is to be understood that the electrical circuit 18 can be any electrical circuit and preferentially represents an electrical circuit that would be in a television transmitter downstream of the power amplification stage. The electrical circuit 18 may contain amplifier stages in addition to the amplifier 10 depicted in FIG. 1. In one embodiment, not shown for clarity, the electrical circuit 18 may include the amplifier 10. The variable power supply 12 supplies a voltage to the amplifier 10 in response to the control signal 13 from the system controller 14.

The system controller 14 preferentially includes sensing means for sensing the operating conditions, as defined above, via sensors 17A, 17B, and 17C adapted to sense the operating conditions, of the input signal 11, the amplifier 10, and the electrical circuit 18. Sensors 17A, 17B, and 17C transmit sensing signal 15A, 15B, and 15C, respectively, to the sensing means in the system controller 14. The sensing means may also include a lookup table so that a control signal 13 can be sent to the variable power supply 12 so as to dynamically adjust the voltage being supplied by the variable power supply to the amplifier 10 as a function of the operating conditions sensed.

The sensing means is comprised of known prior art components and circuitry for operating as described herein. The sensing means includes the sensors 17A and 17B for sensing the operating conditions of the circuit shown in FIG. 1. Preferentially, the sensing means includes a lookup table for determining the amount of amplification to be applied to the input signal 11 by the amplifier 10 as a function of the sensed operating conditions and for sending the control signal 13 to the variable power supply 12 thereby controlling the voltage level supplied by the variable power supply to the amplifier in response to one or more of the sensed operating conditions.

The user interface 16 may be used to interface with the system controller 14 so that human interaction with the circuit depicted in FIG. 1 is possible. The user interface 16 may be used to manually control the voltage supplied by the variable power supply 12 to the amplifier 10 either in response to one or more of the operating conditions or altogether independent of the operating conditions, as discussed above.

In one mode of operation, the circuit shown in FIG. 1 the input signal 11 is applied to an input terminal of the amplifier 10. The input signal 11 may be an 8VSB or COFDM signal as described herein. The sensors 17A, 17B, and 17C sense the operating conditions as described herein. The system controller 14, which comprises sensing means including a lookup table, as later described herein, accesses the lookup table to determine the characteristics of the control signal 13 based on one or more of the operating conditions. The system controller 14 sends a control signal 13 to the variable power supply 12, which is responsive to the particular characteristics of the control signal 13, such as voltage or current level, frequency, or phase, so as to dynamically control the voltage of the power supplied to the amplifier 10 as a function of one or more of the sensed operating condition or conditions.

With reference now to FIG. 2, a lookup table 20 is depicted illustrating the indexing of the table by the operating conditions 22 so as to extract a control signal 13 for controlling the variable power supply 12 in any of FIGS. 1, 3, 4, or 5.

The lookup table 20 may be populated by collecting data on the performance of a test amplifier representative of the design of the amplifier 10 in response to input signals generated by an 8VSB or COFDM signal source where the test amplifier is connected to an instrumented test load. Similarly, the lookup table 20 may be populated by collecting data on the performance of a test amplifier/test network system representative of the design of the amplifier 10 and the electrical circuit 18 in response to input signals of any modulation and of any frequency within the frequency range of the amplifier 10. The signal source may generate input signals such as the amplifier 11 may receive during the operation of the circuit in any of FIG. 1, 3, 4, or 5. The test amplifier may be operated under a nominal supply voltage at a number of input signal frequencies in the expected operating range of the circuit in any of FIG. 1, 3, 4, or 5 while maintaining the required spectral containment, average output power, and amplifier efficiency and/or power dissipation. The test amplifier may then be operated at supply voltages above and below the nominal supply voltage. The results of these tests may be used to populate the lookup table 20 in FIG. 2. The lookup table may be populated, either alternatively or in conjunction with the description above, by collecting data from the actual operating circuit shown in FIG. 1 by known techniques.

Figure 3:
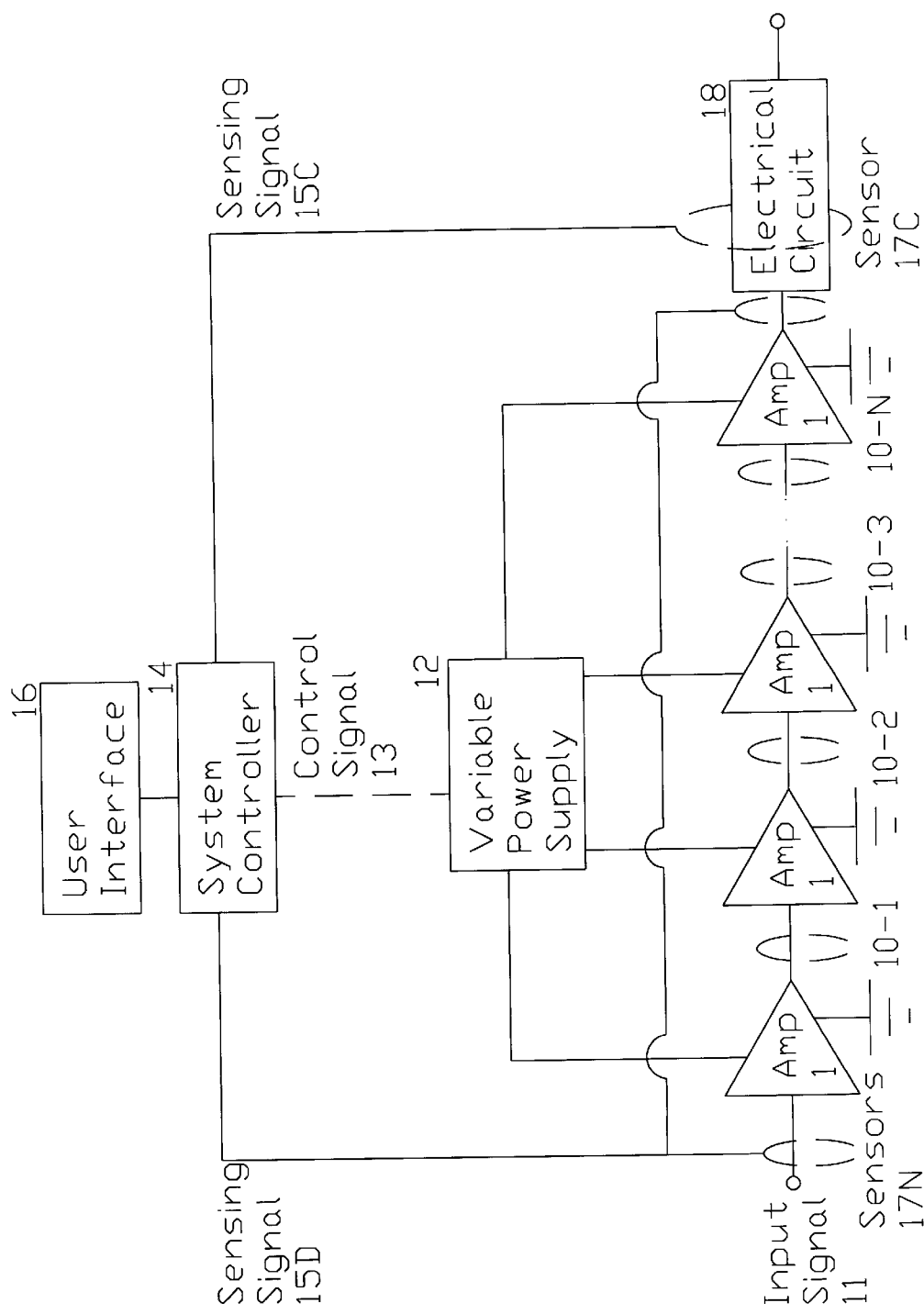
FIG. 3 is a simplified schematic circuit diagram of a second embodiment of the present invention illustrating a series cascade of amplifier stages powered by a single variable power supply.

With reference now to FIG. 3, where like numerals represent like components in FIG. 1, which operate in a like manner, a second embodiment of the invention is shown where the amplifiers 10-1 through 10-N are arranged in a cascaded series. A plurality of amplifiers is contemplated in the cascaded series shown, such as two amplifiers, three amplifiers, etc. In this embodiment, the variable power supply 12 is shown as supplying power to each of the cascaded amplifiers. The system controller 14, which preferentially comprises sensing means including a lookup table as described above, receives the sensing signals 15D and 15C. The sensing signal 15D may originate from one or more of the sensors 17N. Only one of the sensors 17N is labeled in FIG. 3 for clarity, but it is to be understood that the sensing signal 15D may originate from any of the sensors 17N shown immediately preceding or following one of the cascaded amplifiers 10-1 through 10-N. Sensing signal 15C may originate from the sensor 17C sensing the operating conditions of the electrical circuit 18 as described above in the description of FIG. 1.

In one embodiment of the present invention, an electrical circuit, such as the electrical circuit 18 shown in the Figures, may be included after each or some of the amplifiers 10-1 through 10-N. Where there is more than one electrical circuit, the electrical circuits may all be the same, some of the electrical circuits may be the same as some other electrical circuits, or all of the electrical circuits may be different.

In one mode of operation, the circuit shown in FIG. 3 senses one or more of the operating conditions via one or more of sensors 17N and/or 17C and a sensing signal 15D and/or 15C, respectively, may be sent to the system controller 14. The system controller comprises a sensing means, as described above, including a lookup table. The lookup table determines the characteristics of the control signal 13 as a function of one or more of the operating conditions. The control signal 13 is sent from the system controller 14 to the variable power supply 12 so as to dynamically control the voltage of the power supplied to the amplifier 10 as a function of one or more of the sensed operating condition or conditions.

In the particular embodiment shown in FIG. 3, the amplifiers 10-1 through 10-N are dynamically adjusted in concert as the variable power supply 12 is adjusted in response to one or more of the sensed operating conditions.

Figure 4:
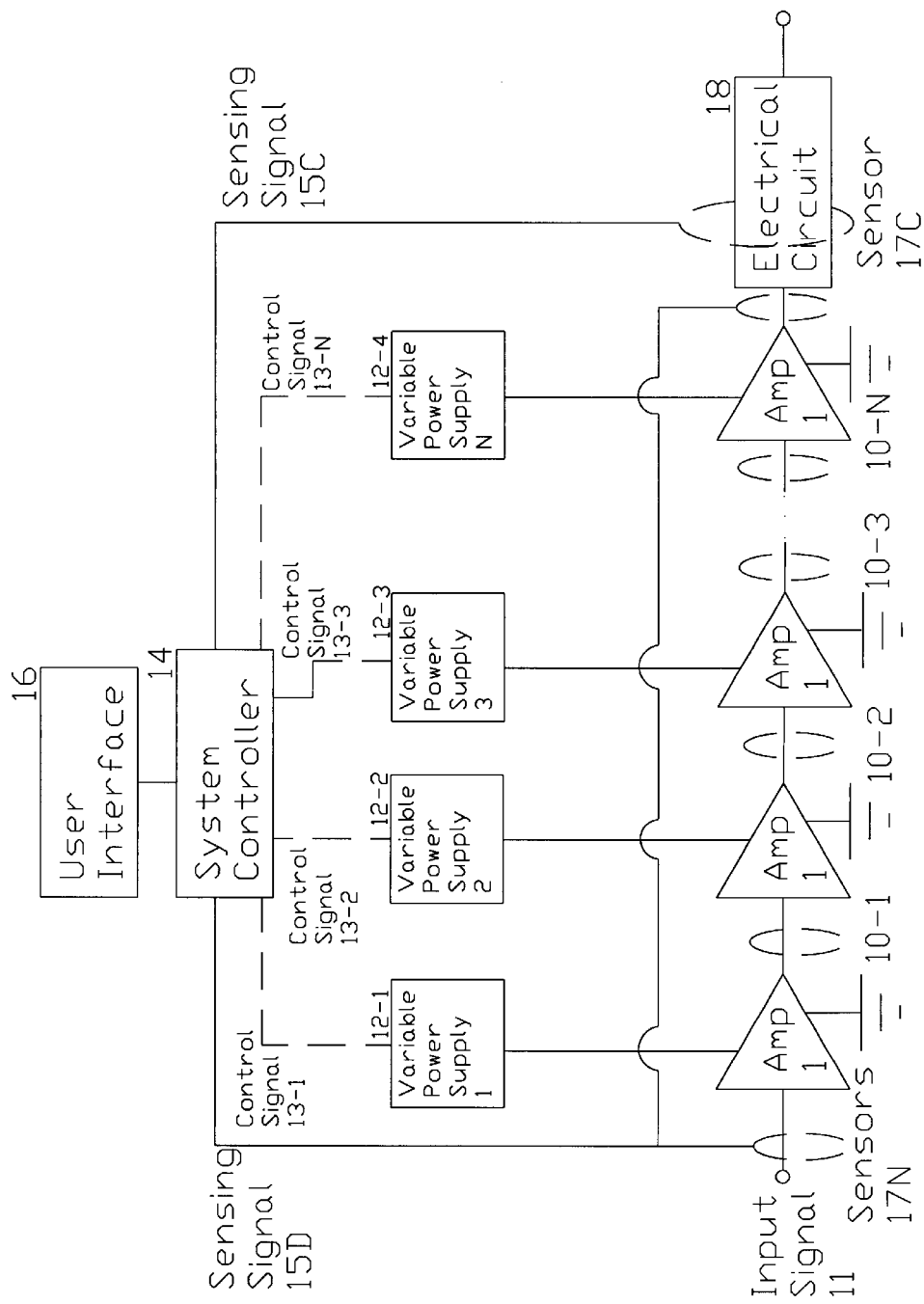
FIG. 4 is a simplified schematic circuit diagram of a third embodiment of the present invention illustrating a series cascade of amplifier stages where each amplifier stage is powered by a separate variable power supply.

With reference now to FIG. 4, where like numerals represent like components in FIGS. 1 and 3, which operate in a like manner, a third embodiment of the invention is shown where the amplifiers 10-1 through 10-N are arranged in a cascaded series. A plurality of amplifiers is contemplated in the cascaded series shown, such as two amplifiers, three amplifiers, etc. In this embodiment, a one of variable power supply 12-1 through 12-N is associated with each one of the amplifiers 10-1 through 10-N, respectively, as shown. The system controller 14, which preferentially comprises sensing means including at least one lookup table as described above, receives the sensing signals 15D and 15C. As described above in the description of FIG. 3, the sensing signal 15D may originate from one or more of the sensors 17N. Only one of the sensors 17N is labeled in FIG. 4 for clarity, but it is to be understood that the sensing signal 15D may originate from any of the sensors 17N shown immediately preceding or following one of the cascaded amplifiers 10-1 through 10-N. Sensing signal 15C may originate from the sensor 17C sensing the operating conditions of the electrical circuit 18 as described above in the description of FIG. 3.

As with the circuit in FIG. 3 above, an electrical circuit, such as the electrical circuit 18, may be placed after some or all of the amplifiers 10-1 through 10-N.

The system controller 14 may send one or more of the control signals 13-1 through 13-N to the variable power supplies 12-1 through 12-N, respectively, so as to control the amplifiers 10-1 through 10-N in response to one or more of the sensed operating conditions. The system controller 14 includes sensing means, as described above, which may include one or more lookup tables and may include one lookup table for each of the variable power supply/amplifier combinations. The system controller 14 may be capable of controlling each of the variable power supplies 12-1 through 12-N separately, all together as one unit, or as multiple groups of varying numbers of amplifiers.

In one mode of operation, the circuit shown in FIG. 4 senses one or more of the operating conditions via one or more of sensors 17N and/or 17C and a sensing signal 15D and/or 15C, respectively, may be sent to the system controller 14. The system controller comprises a sensing means, as described above, including at least one lookup table. Any one of the lookup tables may determine the characteristics of a control signal 13-1 through 13-N as a function of one or more of the operating conditions. The control signals 13-1 through 13-N may be sent from the system controller 14 to one or more of the variable power supplies 12-1 through 12-N so as to dynamically control the voltage of the power supplied to one or more of the amplifiers 10-1 through 10-N as a function of one or more of the sensed operating condition or conditions.

Figure 5:
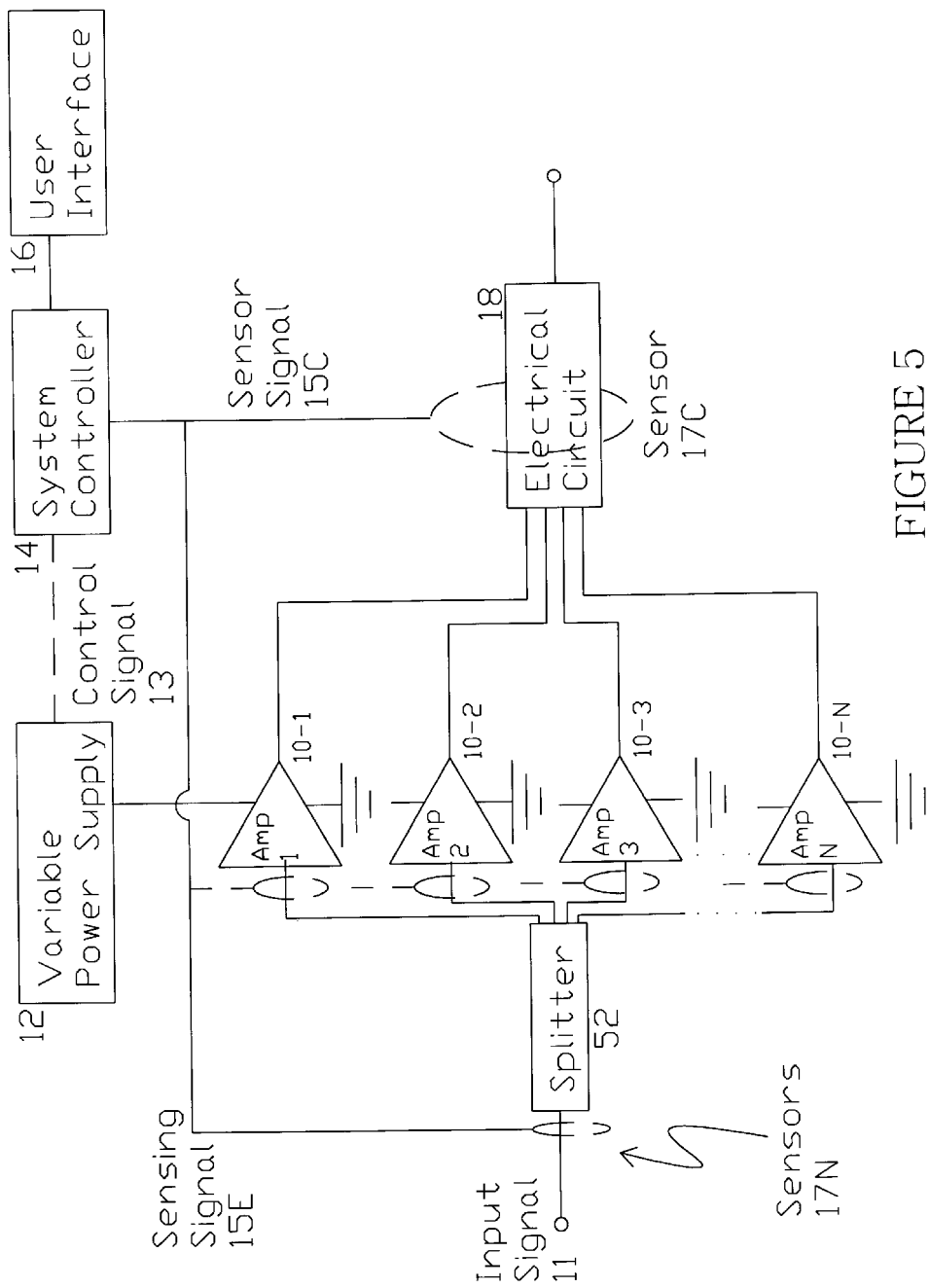
FIG. 5 is a simplified schematic circuit diagram of a fourth embodiment of the present invention illustrating a parallel cascade of amplifier stages where select sensing signal connections and power supply connections are not shown for clarity.

With reference now to FIG. 5, where like numerals represent like components in FIGS. 1, 3, and 4 which operate in a like manner, a fourth embodiment of the invention is shown where the amplifiers 10-1 through 10-N are arranged in a parallel cascade. A plurality of amplifiers is contemplated in the parallel cascade shown, such as two amplifiers, three amplifiers, etc. In this embodiment, the variable power supply 12 is shown as supplying power to each of the parallel cascade of the amplifiers 10-1 through 10-N as shown. It is to be understood that the present invention also contemplates an individual variable power supply for each of the amplifiers 10-1 through 10-N, similar to the arrangement shown in the embodiment in FIG. 4. The embodiment with a plurality of variable power supply/amplifier pairs in a parallel cascade is not shown but may be inferred from this description.

The system controller 14, which preferentially comprises sensing means including at least one lookup table as described above, receives the sensing signals 15E and 15C. The sensing signal 15E is analogous to the sensing signal 15D as described above in the description of FIG. 3. The sensing signal 15E may originate from one or more of the sensors 17N. Only two of the sensors 17N are connected to the system controller 14 for clarity and only one of the sensors 17N is labeled in FIG. 5 for clarity, but it is to be understood that the sensing signal 15E may originate from any of the sensors 17N shown immediately preceding or following one of the parallel cascade amplifiers 10-1 through 10-N. Sensing signal 15C may originate from the sensor 17C sensing the operating conditions of the electrical circuit 18 as described above in the description of FIG. 3.

The electrical circuit 18 may preferentially include a combiner (not shown for clarity) to combine the output signals from the amplifiers 10-1 through 10-N. The electrical circuit 18 may also include one or more of the amplifiers 10-1 through 10-N.

The system controller 14 may send the control signal 13 to the variable power supply 12 so as to control the amplifiers 10-1 through 10-N in response to one or more of the sensed operating conditions. The system controller 14 includes sensing means, as described above, including a lookup table, the operation of which is as described above.

In one mode of operation, the circuit shown in FIG. 5 senses one or more of the operating conditions via one or more of sensors 17N and/or 17C and a sensing signal 15E and/or 15C, respectively, may be sent to the system controller 14. The system controller comprises a sensing means, as described above, including a lookup table. The lookup tables may determine the characteristics of the control signal 13 as a function of one or more of the operating conditions. The control signal 13 may be sent from the system controller 14 to the variable power supply 12 so as to dynamically control the voltage of the power supplied to one or more of the amplifiers 10-1 through 10-N as a function of one or more of the sensed operating condition or conditions.

As mentioned above, the present invention also contemplates an embodiment comprising a parallel cascade arrangement of amplifier/variable power supply combinations. The operation of this embodiment may be inferred from the description provided above for the embodiments shown in FIGS. 1, 3, 4, and 5.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. An electrical circuit including an amplifier circuit comprising:
   an amplifier including an input terminal for amplifying an input signal applied to said input terminal as a function of an applied voltage;
   a variable power supply for applying a variable voltage to said amplifier; and
   sensing means including a lookup table for sensing an operating condition of said electrical circuit, for determining from said lookup table the amount of voltage to be applied to said amplifier, and for controlling said variable power supply in response thereto;
   whereby the voltage applied to said amplifier by said variable power supply is controlled by said sensing means.

2. The electrical circuit of claim 1 wherein said operating condition is the frequency of said input signal.

3. The electrical circuit of claim 1 wherein said operating condition is the impedance of said electrical circuit.

4. The electrical circuit of claim 1 wherein said operating condition is the efficiency of said amplifier.

5. The electrical circuit of claim 1 wherein said operating condition is the modulation of said input signal.

6. The electrical circuit of claim 5 wherein said input signal is a COFDM signal.

7. The electrical circuit of claim 5 wherein said input signal is an 8VSB signal.

8. The electrical circuit of claim 1 wherein said operating condition is the ratio of peak power to average power of said input signal.

9. The electrical circuit of claim 8 wherein said peak to average power ratio is in the range of 5.5 to 7.5 dB and said input signal is an 8VSB signal.

10. The electrical circuit of claim 8 wherein said peak to average power ratio is approximately 6.5 dB and said input signal is an 8VSB signal.

11. The electrical circuit of claim 8 wherein said peak to average power ratio is in the range of 8 to 10 dB and said input signal is a COFDM signal.

12. The electrical circuit of claim 8 wherein said peak to average power ratio is approximately 9 dB and said input signal is a COFDM signal.

13. The electrical circuit of claim 1 wherein said operating condition is the ratio of peak voltage to average voltage of said input signal.

14. A method of dynamically controlling the amplification linear range applied by an amplifier in an electrical circuit having an input terminal for receiving an input signal comprising the steps of:
   (a) providing an amplifier in an electrical circuit having an input terminal for receiving an input signal;
   (b) amplifying the input signal with the amplification linear range set as a function of an operating condition of the electrical circuit;
   (c) applying a variable voltage to said amplifier from a variable power supply to thereby control the amplification linear range applied by said amplifier to said input signal;
   (d) sensing said operating condition of the electrical circuit;
   (e) determining from a lookup table the desired variable voltage applied to said amplifier as a function of said operating condition;
   (f) controlling the level of said variable voltage applied to said amplifier as a function of said operating condition, thereby dynamically controlling the amplification linear range of said amplifier.

15. The method of claim 14 wherein said operating condition is selected from the group consisting of the frequency of said input signal, the impedance of said electrical circuit, the efficiency of said amplifier, the modulation of said input signal, the ratio of peak power to average power of said input signal, and the ratio of peak voltage to average voltage of said input signal.

16. The method of claim 14 wherein said input signal is a COFDM signal or an 8VSB signal.

17. The method of claim 14 wherein said input signal is an 8VSB signal and wherein said operating condition is the peak to average power ratio of the input signal in the range of 5.0 to 8.0 dB.

18. The method of claim 14 wherein said input signal is a COFDM signal and wherein said operating condition is the peak to average power ratio of the input signal in the range of 7 to 11 dB.

19. In an amplifier for amplifying an input signal as a function of one or more operating conditions of the circuit to which the amplifier is connected by modifying the power supply to the amplifier; the improvement comprising the use of a lookup table responsive to said operating conditions to determine the modification in said power supply output voltage.

20. The amplifier of claim 19 wherein said operating condition is selected from the group consisting of the frequency of said input signal, the impedance of said electrical circuit, the efficiency of said amplifier, the modulation of said input signal, the ratio of peak power to average power of said input signal, and the ratio of peak voltage to average voltage of said input signal.

21. In an amplifier control circuit for effecting a modification in the voltage supply to the amplifier in response to one or more operating conditions of the circuit to which the amplifier is connected, the improvement comprising the use of a lookup table to determine the relationship between said one or more operating condition and said modification.

22. The amplifier control circuit of claim 21 wherein said input signal is a COFDM signal or an 8VSB signal.

23. In a method for controlling the supply voltage to an amplifier in response to one or more operating conditions of the circuit to which the amplifier is connected, the improvement comprising the step of controlling the supply voltage via a lookup table indexed by said one or more operating condition.

24. The method of claim 23 wherein said input signal is an 8VSB signal and wherein said operating condition is the peak to average power ratio of the input signal in the range of 5 to 8 dB.

25. The method of claim 23 wherein said input signal is a COFDM signal and wherein said operating condition is the peak to average power ratio of the input signal in the range of 7 to 11 dB.

26. A television transmitter circuit including a power amplifier circuit capable of amplifying a variable frequency input signal in a predetermined frequency range, comprising:

an amplifier including an input terminal for receiving said input signal;

a variable power supply for supplying a variable voltage to said amplifier; and sensing means including a lookup table for sensing the frequency of said input signal and for dynamically determining from said lookup table the voltage to be applied to said amplifier as a function of said input signal frequency;

whereby said sensing means dynamically controls the variable voltage supplied by said variable power supply to said amplifier as a function of said input signal frequency such that said amplifier amplifies said input signal in response to said input signal frequency.

27. The television transmitter circuit of claim 26 wherein said input signal is a COFDM signal or an 8VSB signal.

28. The television transmitter circuit of claim 26 further comprising a user interface module for adjusting the variable voltage supplied by said variable power supply independently from said sensing means.

29. An electrical circuit comprising:

an amplifier for amplifying an input signal;

a power supply for powering said amplifier;

a sensor for sensing an operational condition of said electrical circuit;

a look up table;

a means for controlling the voltage supplied by said power supply, to said amplifier, in response to the application of the sensed operational condition to said look up table.

30. An electrical circuit comprising:

an amplifier for amplifying an input signal;

a power supply for powering said amplifier a means for determining a desired voltage of the power supply as a function of an operational condition of the electrical circuit and controlling the voltage of the power supply in response to the operation condition.

* * * * *